United States Patent
Asai

(10) Patent No.: US 11,867,919 B2
(45) Date of Patent: Jan. 9, 2024

(54) OPTICAL UNIT, BEAM COUPLING DEVICE, AND LASER PROCESSING MACHINE

(71) Applicant: Panasonic Holdings Corporation, Osaka (JP)

(72) Inventor: Yosuke Asai, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/737,139

(22) Filed: May 5, 2022

(65) Prior Publication Data

US 2022/0260842 A1  Aug. 18, 2022

Related U.S. Application Data

(63) Continuation of application No. PCT/JP2020/025876, filed on Jul. 1, 2020.

(30) Foreign Application Priority Data

Nov. 28, 2019 (JP) .................................. 2019-215505

(51) Int. Cl.
G02B 27/10 (2006.01)
G02B 27/09 (2006.01)
H01S 5/40 (2006.01)

(52) U.S. Cl.
CPC ..... *G02B 27/1006* (2013.01); *G02B 27/0944* (2013.01); *G02B 27/0955* (2013.01); *H01S 5/4087* (2013.01)

(58) Field of Classification Search
CPC ............ G02B 27/1006; G02B 27/0944; G02B 27/0955; H01S 5/4087

(Continued)

(56) References Cited

U.S. PATENT DOCUMENTS 8,318,655 B1  11/2012  Drost et al.
2002/0036904 A1*  3/2002  Kawashima .......... G03F 7/7005
362/276

(Continued)

FOREIGN PATENT DOCUMENTS

WO  2019/163335  8/2019

OTHER PUBLICATIONS

International Preliminary Report on Patentability dated May 17, 2022 in corresponding International (PCT) Patent Application No. PCT/JP2020/025876.

(Continued)

*Primary Examiner* — Wyatt A Stoffa
*Assistant Examiner* — Mitchell T Oestreich
(74) *Attorney, Agent, or Firm* — Wenderoth, Lind & Ponack, L.L.P.

(57) ABSTRACT

An optical unit for guiding a plurality of light beams, includes a plurality of lens portions through which the plurality of light beams are transmitted. The plurality of lens portions are arranged in an arrangement direction that intersects an optical axis direction along which the light beams are transmitted. Each of the lens portions is inclined with respect to a thickness direction intersecting the optical axis direction and the arrangement direction. The optical unit has both end faces in the optical axis direction with a pitch at which the lens portions are arranged in one end face being smaller than a pitch at which the lens portions are arranged in another end face.

10 Claims, 16 Drawing Sheets

(58) Field of Classification Search
USPC .......................................................... 359/618
See application file for complete search history.

(56) References Cited

U.S. PATENT DOCUMENTS

| | | |
|---|---|---|
| 2016/0048028 A1 | 2/2016 | Deutsch et al. |
| 2020/0028332 A1 | 1/2020 | Kobayashi et al. |
| 2020/0379248 A1 | 12/2020 | Ichihashi |

OTHER PUBLICATIONS

International Search Report dated Sep. 29, 2020 in International (PCT) Application No. PCT/JP2020/025876.

* cited by examiner

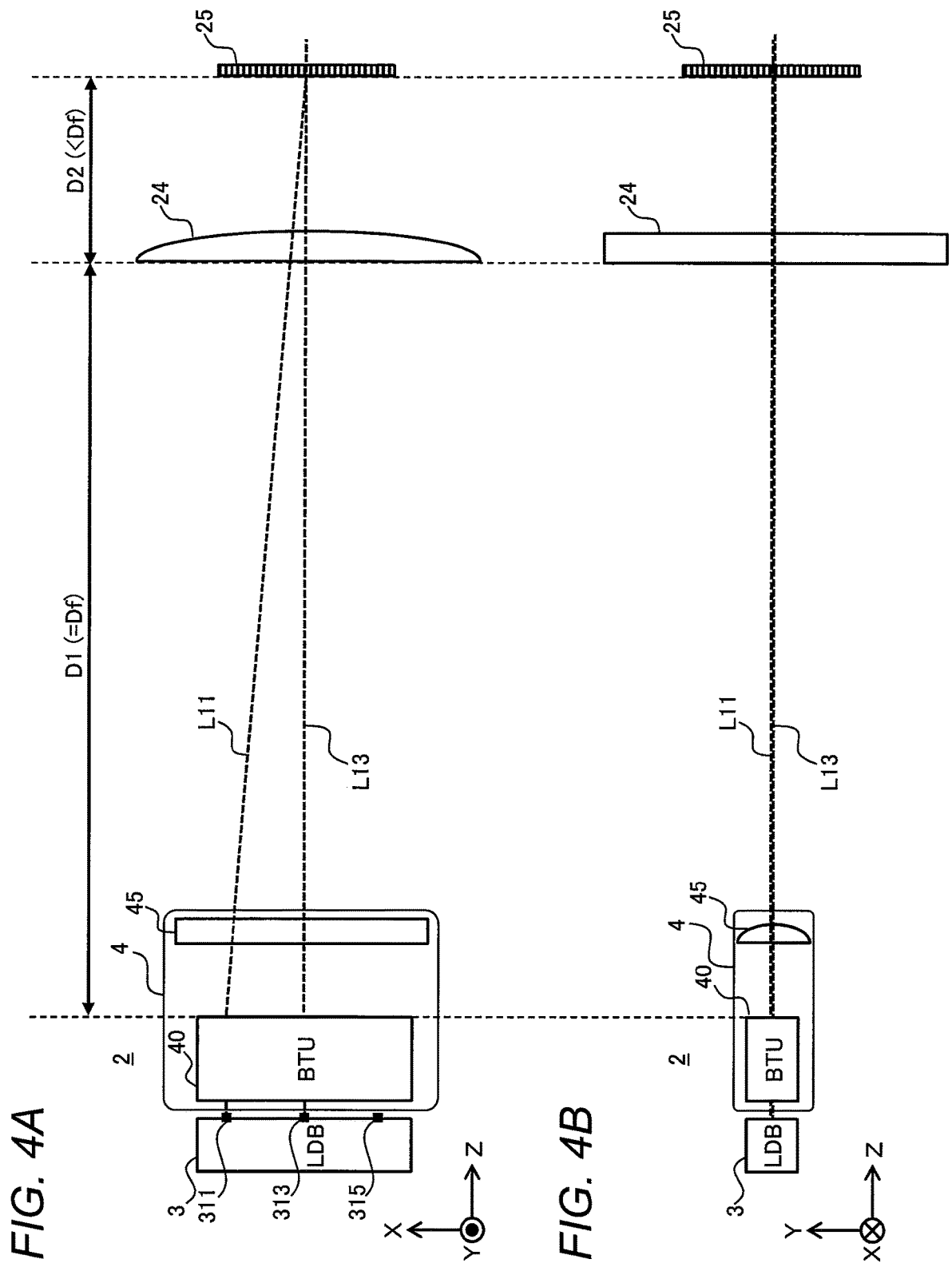

FIG. 10A

| | SURF. No. | X | Y | TANX | TANY |
|---|---|---|---|---|---|
| | OBJECT | 4.00000 | 0.00000 | 0.00000 | 0.00000 |
| FAC { | 1 | 4.00000 | 0.00000 | 0.00000 | 0.00000 |
| | 2 | 4.00000 | 0.00000 | 0.00000 | 0.00000 |
| BT (Wo<Wi) { | 3 | 4.00000 | 0.00000 | 0.00000 | 0.00000 |
| | 4 | 4.00000 | 0.00000 | 0.00000 | 0.00000 |
| | 5 | 4.00000 | 0.00000 | 0.00000 | 0.00000 |
| | 6 | 4.00000 | 0.00000 | −0.00346 | 0.00346 |
| SAC { | 7 | 3.83859 | 0.16141 | −0.00346 | 0.00346 |
| | 8 | 3.82712 | 0.17288 | −0.00229 | 0.00229 |
| COUPLING LENS { | 9 | 3.82712 | 0.17288 | −0.00346 | 0.00000 |
| | 10 | 0.12549 | 0.17316 | −0.00346 | 0.00000 |
| | 11 | 0.11402 | 0.17316 | −0.00229 | 0.00000 |
| DIFFRACTION ELEMENT | 12 | 0.11402 | 0.17316 | −0.00356 | 0.00000 |
| | IMAGE | 0.00722 | 0.17317 | −0.00356 | 0.00000 |

FIG. 10B

| | SURF. No. | X | Y | TANX | TANY |
|---|---|---|---|---|---|
| | OBJECT | 4.00000 | 0.00000 | 0.00000 | 0.00000 |
| FAC { | 1 | 4.00000 | 0.00000 | 0.00000 | 0.00000 |
| | 2 | 4.00000 | 0.00000 | 0.00000 | 0.00000 |
| Rotated BT (Wo=Wi) { | 3 | 4.00000 | 0.00000 | 0.00000 | −0.00347 |
| | 4 | 4.00000 | −0.00007 | 0.00000 | −0.00347 |
| | 5 | 4.00048 | −0.00346 | 0.00032 | −0.00226 |
| | 6 | 4.00048 | −0.00346 | −0.00346 | −0.00001 |
| SAC { | 7 | 3.83905 | −0.00381 | −0.00346 | −0.00001 |
| | 8 | 3.82758 | −0.00383 | −0.00229 | 0.00000 |
| COUPLING LENS { | 9 | 3.82758 | −0.00383 | −0.00346 | 0.00007 |
| | 10 | 0.12525 | 0.07022 | −0.00346 | 0.00007 |
| | 11 | 0.11378 | 0.07045 | −0.00229 | 0.00005 |
| DIFFRACTION ELEMENT | 12 | 0.11378 | 0.07045 | −0.00356 | 0.00007 |
| | IMAGE | 0.00697 | 0.07252 | −0.00356 | 0.00007 |

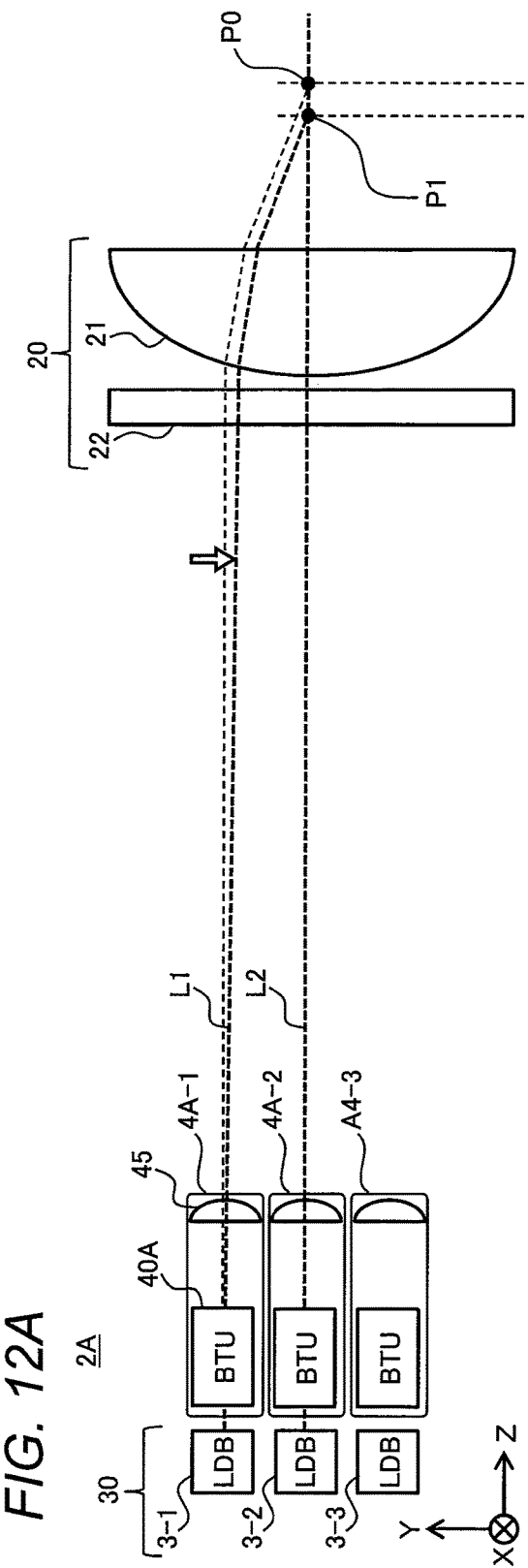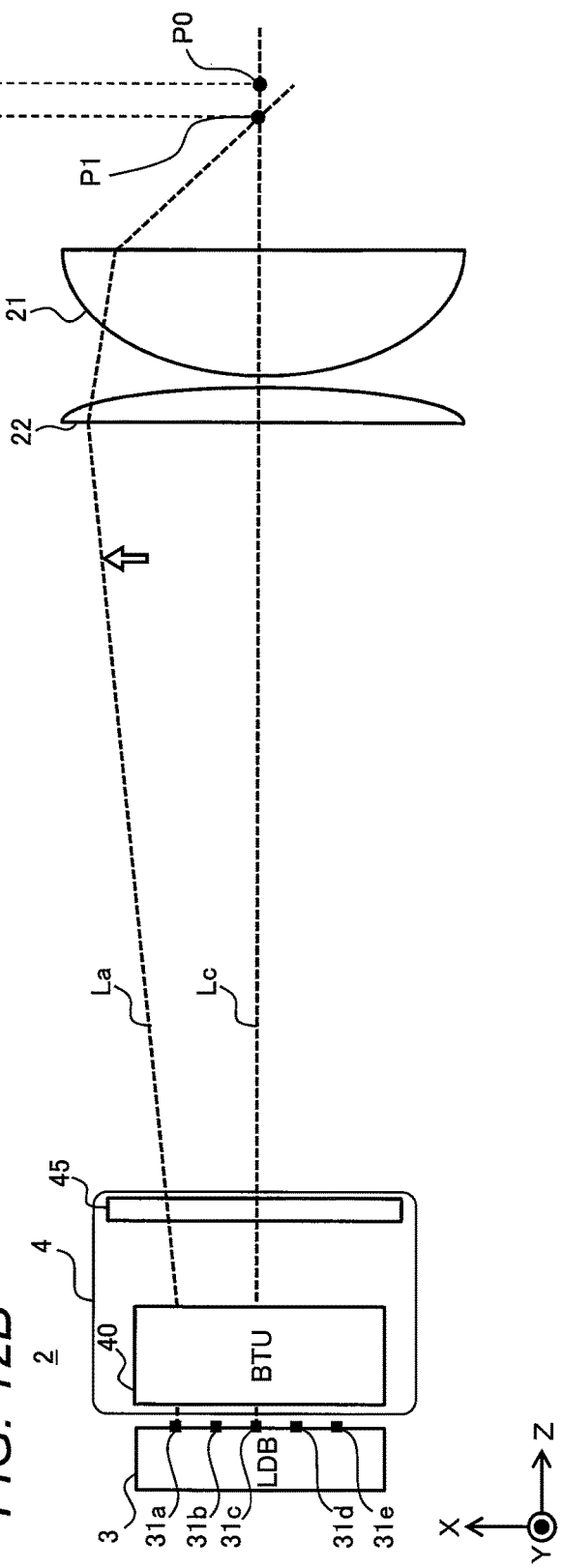

FIG. 16

| | SURF. No. | X | Y | TANX | TANY |
|---|---|---|---|---|---|
| | OBJECT | 4.00000 | 0.00000 | 0.00000 | 0.00000 |
| FAC { | 1 | 4.00000 | 0.00000 | 0.00000 | 0.00000 |
| | 2 | 4.00000 | 0.00000 | 0.00000 | 0.00000 |
| | 3 | 4.00000 | 0.00000 | 0.00000 | 0.00000 |
| BT (Wo>Wi) { | 4 | 4.00000 | 0.00000 | 0.00000 | 0.00000 |
| | 5 | 4.00000 | 0.00000 | 0.00000 | 0.00000 |
| | 6 | 4.00000 | 0.00000 | 0.00443 | 0.00443 |
| SAC { | 7 | 4.05255 | 0.05255 | 0.00443 | 0.00443 |
| | 8 | 4.06461 | 0.06461 | 0.00301 | 0.00301 |
| | 9 | 4.06461 | 0.06461 | 0.00443 | 0.00003 |
| CYLINDRICAL LENS { | 10 | 6.15909 | 0.08019 | 0.00443 | 0.00003 |
| | 11 | 6.16964 | 0.08027 | 0.00301 | 0.00002 |
| CONDENSER LENS { | 12 | 6.16939 | 0.08027 | -0.00817 | 0.00003 |
| | 13 | 6.16055 | 0.08031 | -0.00817 | 0.00003 |
| | 14 | 4.43639 | 0.05970 | -0.09200 | -0.00111 |
| | IMAGE | 0.00027 | 0.00639 | -0.13587 | -0.00163 |

OPTICAL UNIT, BEAM COUPLING DEVICE, AND LASER PROCESSING MACHINE

BACKGROUND

1. Technical Field

The present disclosure relates to an optical unit, a beam coupling device including the optical unit, and a laser processing machine including the beam coupling device.

BACKGROUND ART

2. Related Art

US 2016/0048028 A1 discloses a wavelength beam combining laser system in which individual light beams are superposed to form a coupling beam. US 2016/0048028 A1 discloses that light beams from a plurality of diode bars are condensed on an optical fiber from the viewpoint of increasing light outputs. Further, for the purpose of reducing the size of the laser system, an optical system for removing arrangement of a coupling lens in wavelength beam combining from a focal length is separately included, and a beam rotor is rotated.

SUMMARY

The present disclosure provides an optical unit capable of improving a degree of freedom in design for guiding a plurality of light beams, a beam coupling device, and a laser processing machine.

The optical unit according to the present disclosure is provided for guide a plurality of light beams. The optical unit includes a plurality of lens portions through which the plurality of light beams are transmitted. The plurality of lens portions are arranged in an arrangement direction that intersects an optical axis direction along which the light beams are transmitted. Each of the lens portions is inclined with respect to a thickness direction intersecting the optical axis direction and the arrangement direction. The optical unit has both end faces in the optical axis direction, with a pitch at which the lens portions are arranged in one end face being smaller than a pitch at which the lens portions are arranged in another end face.

The beam coupling device according to one aspect of the present disclosure includes a light source that includes a plurality of light emitters capable of resonating at different wavelengths, the above-mentioned optical unit, and a diffraction element. The light source is arranged to emit a plurality of light beams from the light emitters respectively. The optical unit is arranged to guide each of the light beams from the light source. The diffraction element is arranged to diffract each of the light beams incident from the light source via the optical unit, for coupling the plurality of light beams that resonate at different wavelengths. The optical unit is arranged with the diffraction element facing the end face in which the pitch of the lens portion is smaller among pitches in the both end faces.

The beam coupling device according to another aspect of the present disclosure includes a light source that includes a plurality of light emitters arranged in the arrangement direction and the thickness direction, a plurality of the optical units, and a coupling optical system. The light source is arranged to emit a plurality of light beams from each of the light emitters. The plurality of optical units is arranged to guide each of the light beams for each set of the light emitters arranged in the arrangement direction in the light source. The coupling optical system is arranged to couple the plurality of light beams guided by each optical unit. The optical unit is arranged with the coupling optical system facing the end face in which the pitch of the lens portion is larger among pitches in the both end faces.

The laser processing machine according to the present disclosure includes any beam coupling device described above and a processing head arranged to irradiate an object to be processed with a light beam coupled by the beam coupling device.

According to the optical unit, the beam coupling device, and the laser processing machine according to the present disclosure, it is possible to improve the degree of freedom in design for guiding a plurality of light beams.

BRIEF DESCRIPTION OF THE DRAWINGS

FIGS. 4A and 4B are diagrams illustrating a configuration of a beam coupling device according to the first embodiment.

FIGS. 10A and 10B are diagrams illustrating an example of the beam coupling device of the first embodiment.

FIGS. 12A and 12B are diagrams illustrating a configuration of a beam coupling device according to the second embodiment.

FIG. 16 is a diagram illustrating an example of the beam coupling device of the second embodiment.

DESCRIPTION OF EMBODIMENTS

Hereinafter, embodiments will be described in detail with reference to the drawings as appropriate. However, more detailed explanation than necessary may be omitted. For example, detailed explanations of already well-known matters and duplicate explanations for substantially the same configuration may be omitted. This is to avoid unnecessary redundancy of the following description and to facilitate the understanding of those skilled in the art.

It should be noted that the applicant provides the accompanying drawings and the following description in order for those skilled in the art to fully understand the present disclosure, and does not intend to limit the subject matter described in the claims.

First Embodiment

In the first embodiment, an example of applying an optical unit to a beam coupling device for wavelength beam combining and a laser processing machine provided with the beam coupling device will be described.

1. Laser Processing Machine

A configuration of the laser processing machine and the beam coupling device according to the first embodiment will be described with reference to FIG. 1. FIG. is a diagram illustrating a configuration of a laser processing machine 1 according to the present embodiment.

Figure 1:
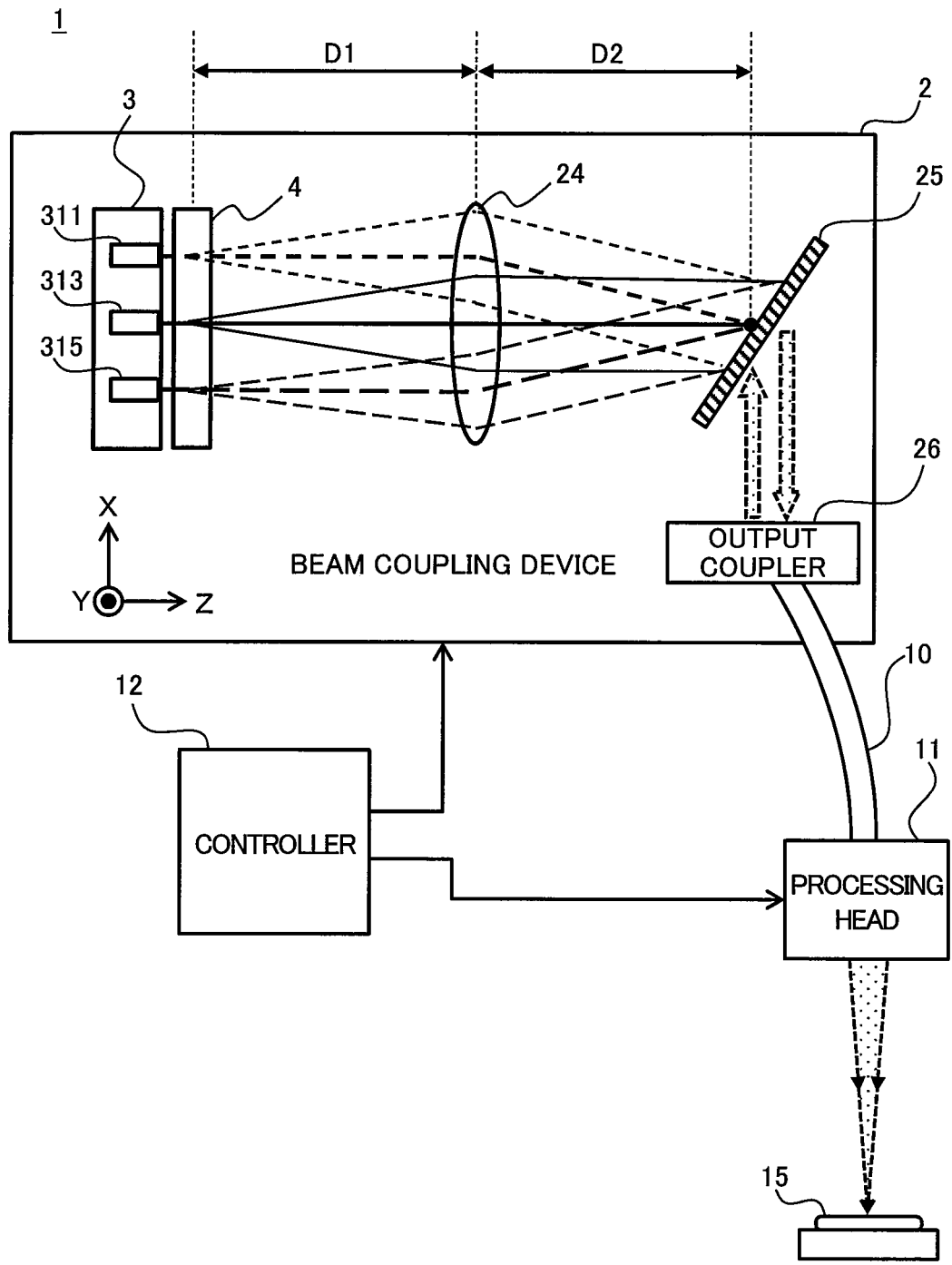
FIG. 1 is a diagram illustrating a configuration of a laser processing machine according to a first embodiment of the present disclosure.

FIG. 1 is a diagram illustrating a configuration of a laser processing machine 1 according to the present embodiment. For example, the laser processing machine 1 includes a beam coupling device 2, a transmission optical system 10, a processing head 11, and a controller 12. The laser processing machine 1 is a device that irradiates various workpieces 15 with laser light to perform various laser processing. For example, the various laser processing include, laser welding, laser cutting, and laser perforation.

The beam coupling device 2 is a device that couples a plurality of light beams emitted separately, in order to supply the laser light of the laser processing machine 1, for example. In the present embodiment, the beam coupling device 2 is configured by adopting wavelength beam combining in which a plurality of light beams are combined with resonating at different wavelengths. The beam coupling device 2 for wavelength beam combining can facilitate to obtain high beam quality and to narrow down the beam diameter.

In the laser processing machine 1, the transmission optical system 10 is an optical system that transmits the laser light from the beam coupling device 2 to the processing head 11, including an optical fiber, for example. The processing head 11 is a device that is arranged to face the workpiece 15 to irradiate the workpiece 15 with a laser light transmitted from the beam coupling device 2, for example.

The controller 12 is a control device that controls the overall operation of the laser processing machine 1. The controller 12 includes, for example, a CPU or MPU that cooperates with software to realize a predetermined function. The controller 12 may be provided with an internal memory for storing various programs and data, and various interfaces capable of inputting oscillation conditions and the like by the operation of the user. The controller 12 may include a hardware circuit such as ASIC or FPGA that realize various functions. Further, the controller 12 may be integrally configured with the drive circuit of the light source.

1-1. Beam Coupling Device

As illustrated in FIG. 1, the beam coupling device 2 of the present embodiment includes an LD bar 3 which is an example of a light source, an optical unit 4, a coupling lens 24, a diffraction element 25, and an output coupler 26, for example. The beam coupling device 2 of the present embodiment constitutes an external resonance type optical resonator that resonates light in an optical path that reciprocates between the LD bar 3 and the output coupler 26.

The LD bar 3 is formed of an array of light emitters including a plurality of LDs (laser diodes) 311 to 315 arranged one-dimensionally. Hereinafter, a direction in which the LDs 311 to 315 are arranged is referred to as "X direction", a direction of the optical axis of the light beam emitted by the LD bar 3 from the LDs 311 to 315 is referred to as "Z direction", and a direction orthogonal to the X and Z directions is referred to as "Y direction".

FIG. 1 illustrates three LD 311, 313, and 315 in the LD bar 3. The number of LDs 311 to 315 included in the LD bar 3 is e.g. tens to hundreds. The plurality of LDs 311 to 315 have a common spontaneous emission spectrum depending on the material of the LD light emitting layer, for example (refer to FIG. 3). Hereinafter, the generic term of LDs 311 to 315 may be referred to as "LD 31". Each LD 31 is an example of a light emitter constituting the emitter of the LD bar 3, to emit a light beam toward the +Z side, respectively.

The optical unit 4 is an optical system that adjusts and guides a plurality of light beams from each LD 31 of the LD bar 3. The optical unit 4 is arranged on the +Z side of the LD bar 3. According to the optical unit 4 of the present embodiment, the degree of freedom in design can be improved for the beam coupling device 2 for wavelength beam combining, which is likely to have a complicated optical design, and the size of the beam coupling device 2 can be reduced. The details of the optical unit 4 will be described later.

The coupling lens 24 is arranged on the +Z side of the optical unit 4 with a distance D1, for example. The distance D1 on the −Z side of the coupling lens 24 is set to the focal length of the coupling lens 24, for example. The plurality of light beams from each LD 31 of the LD bar 3 enters the coupling lens 24 via the optical unit 4, to be are condensed at a position where a distance D2 is placed on the +Z side from the coupling lens 24. The coupling lens 24 collimates each light beam at the condensing.

The diffraction element 25 is arranged at a position of a distance D2 on the +Z side from the coupling lens 24, for example. The diffraction element 25 is a dispersive element in which a transmission type diffraction grating is formed, for example. In the present embodiment, the diffraction grating of the diffraction element 25 satisfies the diffraction conditions for coupling the light beams emitted from a plurality of LDs 311 to 315 to guide in the same direction. The diffraction conditions of the diffraction element 25 is expressed by the following Equation (1), for example.

$$\sin\alpha + \sin\beta = m\lambda/d \qquad (1)$$

where, $\alpha$ is an incident angle of the light beam incident on the diffraction element 25, and $\beta$ is a diffraction angle of the light beam emitted after diffraction. Further, $\lambda$ is a wavelength of the light to be diffracted and corresponds to the resonance wavelength. d is a pitch of the diffraction grating in the diffraction element 25. m is a diffraction order, e.g. a natural number.

Figure 2:
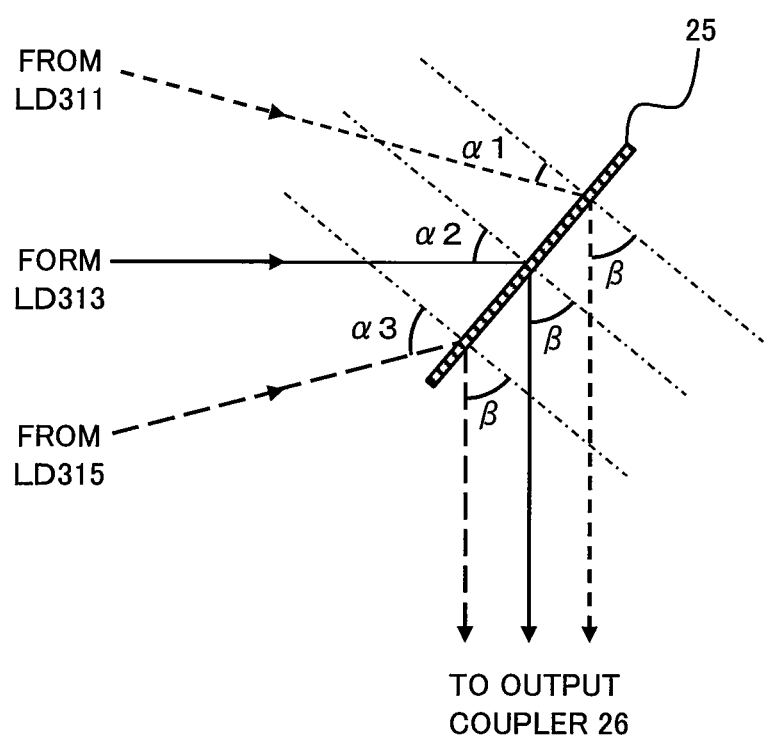
FIG. 2 is a diagram for explaining a method for coupling a light beam in the beam coupling device of the first embodiment.

FIG. 2 is a diagram illustrating a method for coupling a light beam in the diffraction element 25 of the beam coupling device 2. In the diffraction element 25, the incident angles $\alpha=\alpha1$, $\alpha2$, and $\alpha3$ of the light beams from the LD 311, 313, and 315 are different from each other, as illustrated in FIG. 2. In the beam coupling device 2 of the present embodiment, different resonance wavelengths $\lambda$ are set for each LDs 311 to 315 so that the diffraction angles $\beta$ of the LDs 311 to 315 are the same based on the above Equation (1). As a result, the light beams from the plurality of LDs 311 to 315 are emitted from the diffraction element 25 in the same direction after diffraction, to obtain the light beam as a coupling result.

Figure 3:
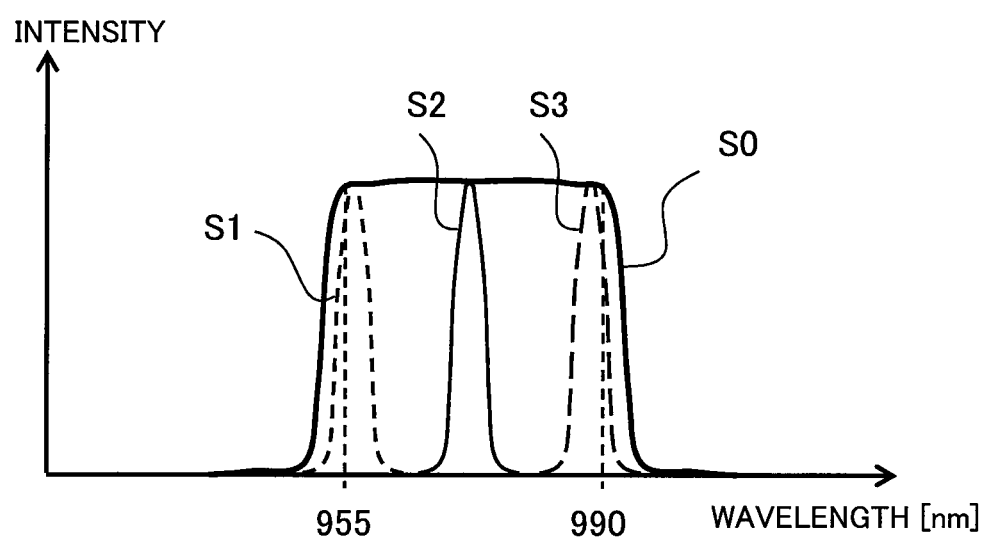
FIG. 3 is a graph illustrating a spectrum of resonant wavelengths in the beam coupling device.

FIG. 3 is a graph illustrating a spectrum of resonance wavelengths λ in the beam coupling device 2. In the graph of FIG. 3, a horizontal axis represents a wavelength [nm] and a vertical axis represents a light intensity.

FIG. 3 illustrates individual resonance spectra S1 to S3 in the plurality of LDs 311 to 315 in the LD bar 3 and the common spontaneous emission spectrum S0. Each of resonance spectra S1, S2, and S3 indicates the distribution of the resonance wavelength λ of each LD 311, 313, and 315. The spontaneous emission spectrum S0 includes a wavelength band in the 900 nm band, e.g. 955 nm to 990 nm. According to the resonance spectra S1 to S3, the resonance wavelength λ is longer as in order from LD 311 to LD 315 based on the positions arranged in the LD bar 3.

As illustrated in FIG. 3, regarding the beam coupling device 2 of the present embodiment, various parameters of the beam coupling device 2 are set so that the resonance spectra S1 to S3 of all LDs 311 to 315 in the LD bar 3 are within the range of the spontaneous emission spectrum S0. For example, the various parameters of the beam coupling device 2 are the pitch of LDs 311 to 315 in the LD bar 3, the focal length of the coupling lens 24, the shape of the diffraction grating in the diffraction element 25, and the distance between the respective portions of the beam coupling device 2.

Returning to FIG. 1, the output coupler 26 is arranged in the direction to which the light beam diffracted by the diffraction element 25 is emitted. The output coupler includes a mirror element having a predetermined transmittance and reflectance, for example. Among the light beams incident on the output coupler 26 from the diffraction element 25, the transmission component corresponding to the transmittance is emitted to the transmission optical system 10 as the output of the beam coupling device 2, for example. On the other hand, the reflection component corresponding to the reflectance is returned to the diffraction element 25 due to optical resonance. The output coupler 26 may be provided with a mechanism capable of adjusting such reflectance and transmittance.

According to the beam coupling device 2 as described above, high beam quality can be obtained by performing wavelength beam coupling as an external resonance type optical resonator. On the other hand, in the external resonance type optical resonator that performs wavelength beam coupling, there is a problem in that the optical design is complicated and the device configuration is large. To address this, the present embodiment provides an optical unit 4 that can improve the degree of freedom in design such an optical design and can reduce the size of the beam coupling device 2.

1-1-1. Details of Beam Coupling Device

The details of the configuration of the beam coupling device 2 according to the present embodiment will be described with reference to FIGS. 4A and 4B. FIG. 4A illustrates a plan view of the beam coupling device 2 as viewed from the Y direction. FIG. 4B illustrates a side view of the beam coupling device 2 as viewed from the X direction.

In the beam coupling device 2 of the present embodiment, the optical unit 4 includes a BTU (beam twister unit) 40 arranged opposite to the LD bar 3, and a SAC (slow axis collimator) 45 arranged on the +Z side of the BTU 40, for example. The coupling lens 24 is configured with a cylindrical lens having a positive refractive power in the X direction, for example. The BTU 40 and the SAC 45 may be provided separately. In this case, the BTU 40 is an example of the optical unit in the present embodiment.

In the present embodiment, the distance D1 from the BTU 40 of the optical unit 4 to the coupling lens 24 is set to a focal length Df of the coupling lens 24, in view of collimating each light beam from the LD bar 3 as described above, for example. On the other hand, the distance D2 from the coupling lens 24 to the diffraction element 25 may be set in view of condensing each light beam on the diffraction element 25, for example.

Here, if a plurality of light beams from the LD bar 3 are incident on the coupling lens 24 in parallel with each other, the above described light condensing causes the distance D2 to the diffraction element 25 to be the focal length Df, resulting in the increased size of the device configuration. Therefore, in the present embodiment, the direction of a plurality of light beams from the LD bar 3 is controlled by the BTU 40 of the optical unit 4.

FIGS. 4A and 4B each exemplify a chief ray L11 of the light beam from the outer LD 311 and a chief ray L13 of the light beam from the central LD 313 in the LD bar 3. In the beam coupling device 2 of the present embodiment, the central LD 313 has the chief ray L13 that travels straight through the optical unit 4 and the coupling lens 24 and is parallel to the Z direction, for example.

According to the BTU 40 of the present embodiment, as illustrated in FIG. 4A, the chief ray L11 of the light beam from the outer LD 311 in the LD bar 3 is directed inward in the X direction. As a result, the plurality of light beams can be condensed with the chief rays L11 and L13 intersecting each other at the distance D2 shorter than the focal length Df from the coupling lens 24, for example. Therefore, the distance D2 to the diffraction element 25 can be shortened from the focal length Df, and the size of the beam coupling device 2 can be reduced.

Further, the arrangement of the coupling lens 24 can be changed by controlling the chief ray directions of the plurality of light beams by the BTU 40. For example, the focal length Df of the coupling lens 24 can be set to an appropriate length from the viewpoint of collimation described above, and can be set to e.g. 1 m or more. Additionally, the degree of freedom in design is also obtained so that a light-condensing function is realized by the collaboration between the BTU 40 and the coupling lens 24.

Further, according to the optical unit 4 of the present embodiment, the chief ray L11 directed inward in the X direction by the BTU 40 can be prevented from being directed inward or outward in the Y direction, as illustrated in FIG. 4B. The external resonance type optical resonator is conceivable that, if the light ray angle of the light beam deviates in the Y direction, the incident angle of the light beam with respect to the output coupler 26 (refer to FIG. 1) changes, thereby causing a problem in optical resonance. In contrast to this, according to the optical unit 4 of the present embodiment, the light ray direction in the X direction can be controlled without interfering with the light ray angle in the Y direction, and the above-mentioned problems can be avoided. As described above, according to the optical unit 4 of the present embodiment, it is possible to improve the degree of freedom in various optical designs for the beam coupling device 2.

2. Optical Unit

Hereinafter, the details of the optical unit 4 of the beam coupling device 2 in the present embodiment will be described.

2-1. Basic Configuration of Optical Unit

Figure 5A:
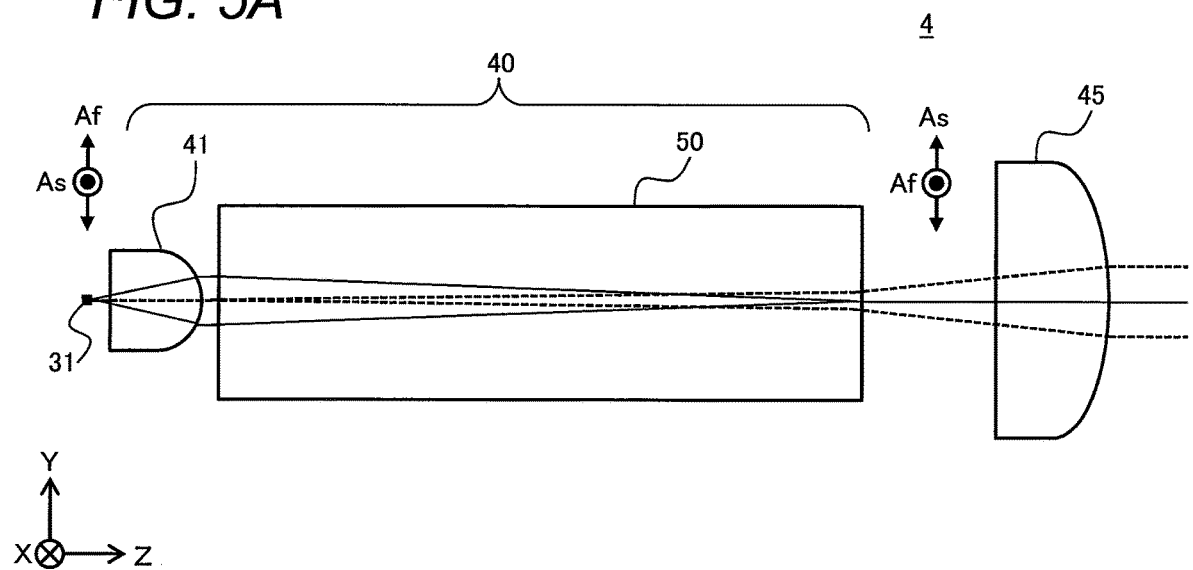
FIGS. 5A and 5B are diagrams illustrating a basic configuration of an optical unit in the beam coupling device.
Figure 5B:
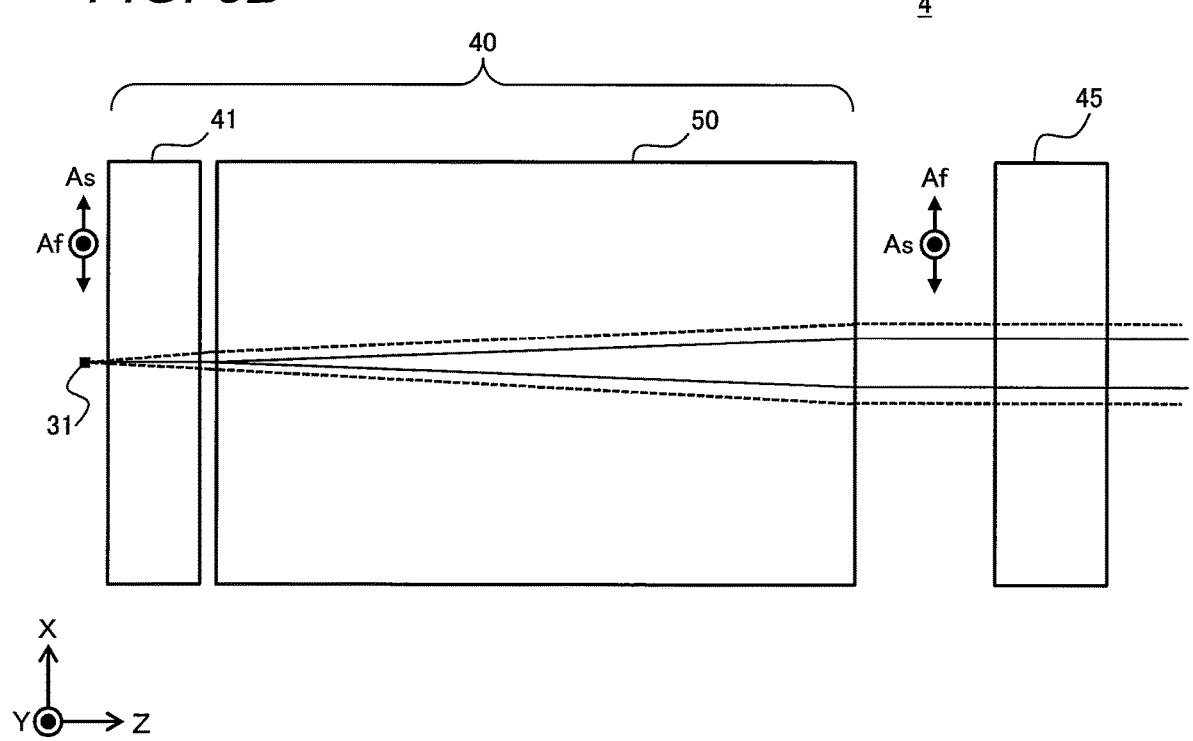

First, the basic configuration of the optical unit 4 will be described with reference to FIGS. 5A to 6. FIGS. 5A and 5B illustrate the basic configuration of the optical unit 4.

FIG. 5A illustrates a plan view of the optical unit 4 in the basic configuration. FIG. 5B illustrates a side view of the optical unit 4 of FIG. 5A. FIGS. 5A and 5B illustrate an optical path of the light beam from one LD 31, such as the central LD 313.

The BTU 40 in the optical unit 4 includes a BT (beam twister) 50 and a FAC (fast axis collimator) 41. In the optical unit 4, the FAC 41, the BT 50, and the SAC 45 are arranged in order from the vicinity of LD 31 to the +Z side, for example.

In the present embodiment, the LD 31 emits a light beam having a fast axis Af and a slow axis As. In the fast axis Af of the light beam, the beam diameter expands more rapidly than in the slow axis As, and it is easier to obtain high beam quality. Before the light beam of LD 31 is incident on the optical unit 4, the fast axis Af of the light beam is directed in the Y direction and the slow axis As is directed in the X direction.

The FAC 41 is provided for collimating a light beam on the fast axis Af, and is formed of a cylindrical lens having a positive refractive power, for example. As illustrated in FIGS. 5A and 5B, the FAC 41 is arranged at a focal length position from the +Z side of the LD bar 3 with the longitudinal direction being the X direction, for example. In this example, the light beam from LD 31 is collimated by the FAC 41 in the Y direction (i.e., the fast axis Af), and then incident on BT 50.

Figure 6:
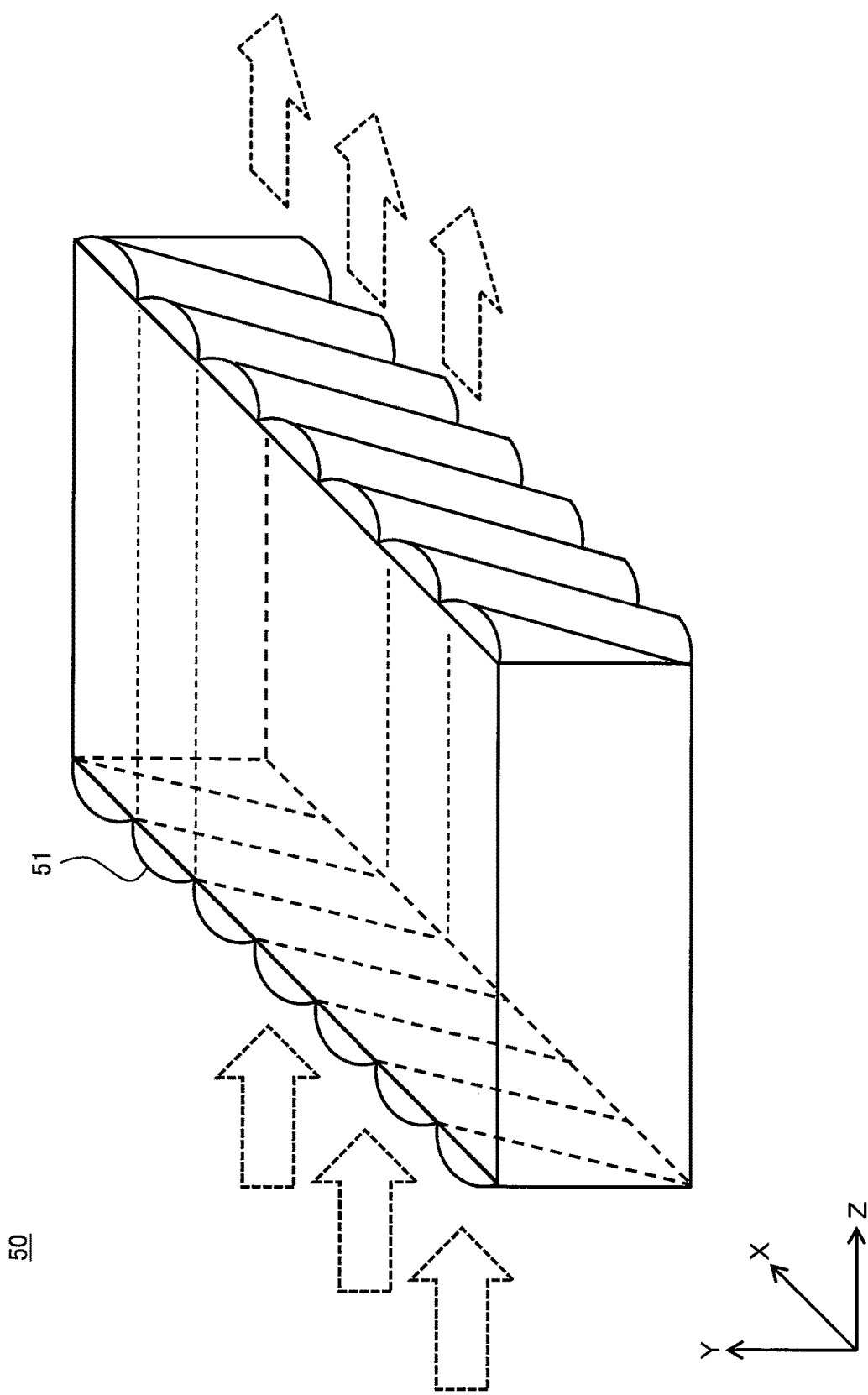
FIG. 6 is a perspective view illustrating a configuration example of a beam twister unit in the optical unit.

FIG. 6 illustrates a configuration example of the BT 50. For example, the BT 50 is an optical element that rotates a plurality of light beams respectively, and the BT 50 includes a plurality of oblique lens portions 51. The oblique lens portion 51 is a portion of the BT 50 that constitutes a lens for each LD 31, and constitutes e.g. a cylindrical lens. The BT 50 and the FAC 41 may be provided separately. In this case, the BT 50 is an example of the optical unit in the present embodiment.

The BT 50 is formed so as to arrange a plurality of oblique lens portions 51 at a predetermined pitch in the X direction, for example. In this configuration example, the oblique lens portion 51 is inclined by 45° with respect to the both arrangement direction (i.e., X direction) and the thickness direction (i.e., Y direction) of the BT 50. The inclination of the oblique lens portion 51 in the BT 50 does not necessarily have to be 45°, and may be 40° to 50° with respect to the Y direction, for example.

In the example of FIGS. 5A and 5B, the BT 50 rotates the light beam incident from the LD 31 through the FAC 41 by a rotation angle of 90° in the XY plane. As a result, the slow axis As of the light beam emitted from the BT 50 is oriented in the Y direction, and the fast axis Af is oriented in the X direction. The light beam emitted from the BT 50 is divergent light in the Y direction and parallel light in the X direction.

The SAC 45 is provided for collimating a light beam on the slow axis As, and is formed of a cylindrical lens having a positive refractive power, for example. As illustrated in FIGS. 5A and 5B, the SAC 45 is arranged at a focal length position from the +Z side of the BTU 40 with the longitudinal direction being the X direction, for example. In this example, the light beam from the BT 50 is collimated by the SAC 45 in the Y direction (i.e., the slow axis As), and then exits from the optical unit 4.

According to the above optical unit 4, the light beam emitted from each LD 31 of the LD bar 3 is basically collimated in the fast axis Af and the slow axis As. However, due to the wave characteristics of light, the beam diameter can widen by an influence of waves from the +Z side surface of the BT 50, particularly in the fast axis Af. To address this, the beam coupling device 2 of the present embodiment makes possible to suppress the above-mentioned influence by collimating each light beam by the coupling lens 24.

2-2. BT of Optical Unit

In the present embodiment, various chief rays are controlled by adjusting the arrangement of the oblique lens portion 51 in the BT 50 as well as utilizing the basic functions of each portion of the optical unit 4 as described above. Hereinafter, a configuration example of such an optical unit 4 will be described.

Figure 7:
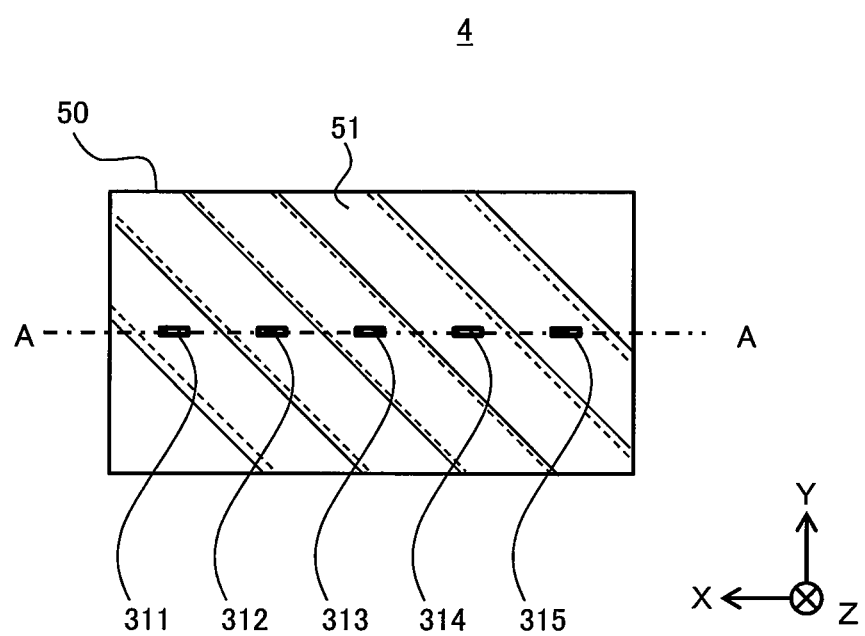
FIG. 7 illustrates a configuration example of the optical unit in the first embodiment.

FIG. 7 illustrates a configuration example of the BT 50 of the optical unit 4 in the present embodiment. FIG. 7 illustrates a front view of the optical unit 4 as viewed from the −Z side together with a plurality of LDs 311, 312, 313, 314, and 315. For example, the light beams from LDs 311 to 315 pass through the facing lens portions 51 from the −Z side to the +Z side, with the Z direction being the optical axis direction. The BT 50 of the present embodiment is configured by shifting the pitch of the oblique lens portion 51 between both end faces of the ±Z sides, that is, the emission side and the incident side of the light beam from each LD 31.

Figure 8:
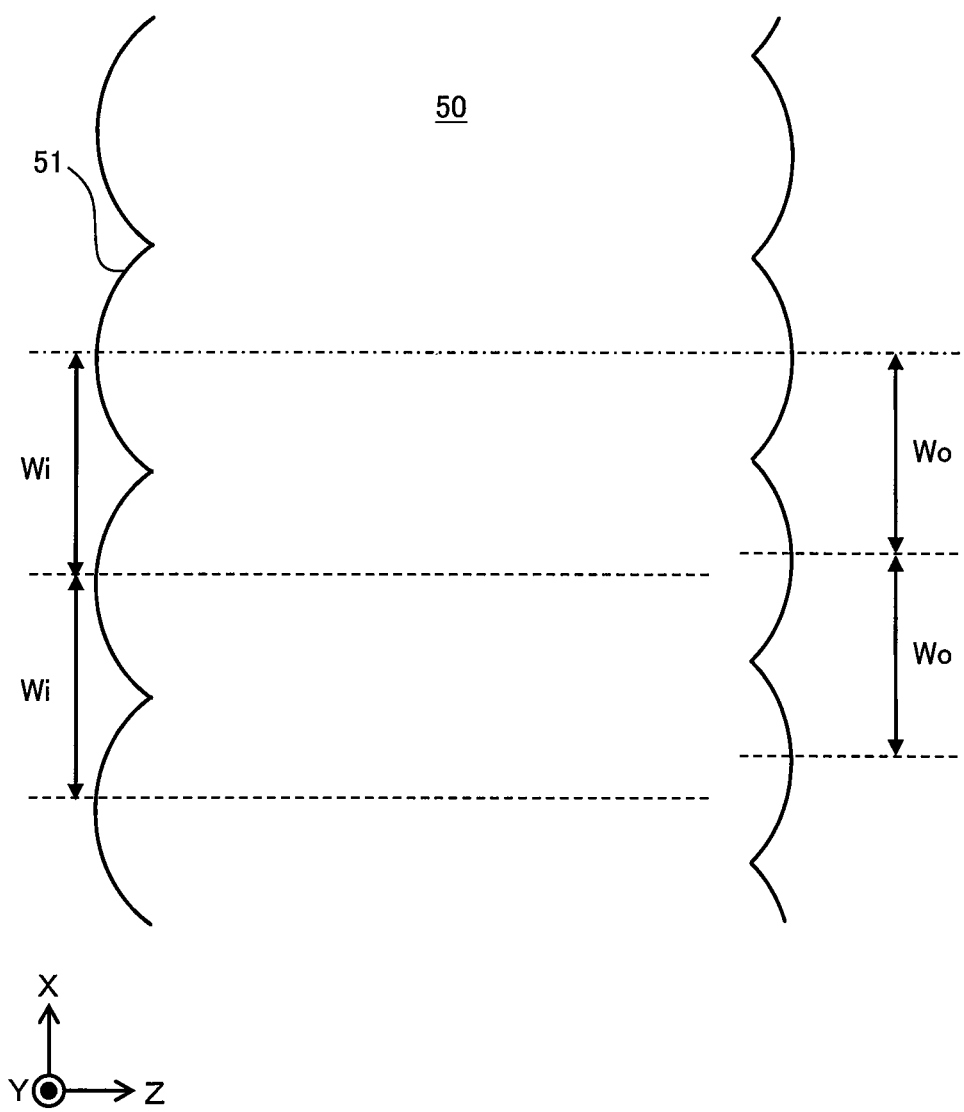
FIG. 8 is a cross-sectional view of the optical unit of FIG. 7.

FIG. 8 illustrates a cross-sectional view of an XZ plane in the BT 50 of FIG. 7. The BT 50 of this configuration example is configured so that a pitch Wo between the oblique lens portions 51 on the end face on the +Z side is smaller than a pitch Wi on the end face on the −Z side. The pitch Wi on the −Z side is set to be the same as the pitch between the LDs 31 in the LD bar 3, for example. In the BT 50 of this configuration example, the center of the central oblique lens portion 51 matches on both sides of the ±Z side, for example.

For example, a difference between the pitches Wi and Wo is set to be sufficiently smaller than each of the pitches Wi and Wo, and is e.g. 0.1 times or less of each of the pitches Wi and Wo. The difference between the pitches Wi and Wo may be set in consideration of the number of the oblique lens portions 51 or LD 31. For example, the difference between the pitches Wi and Wo is 0.0001 times or more that of each of the pitches Wi and Wo.

Figure 9A:
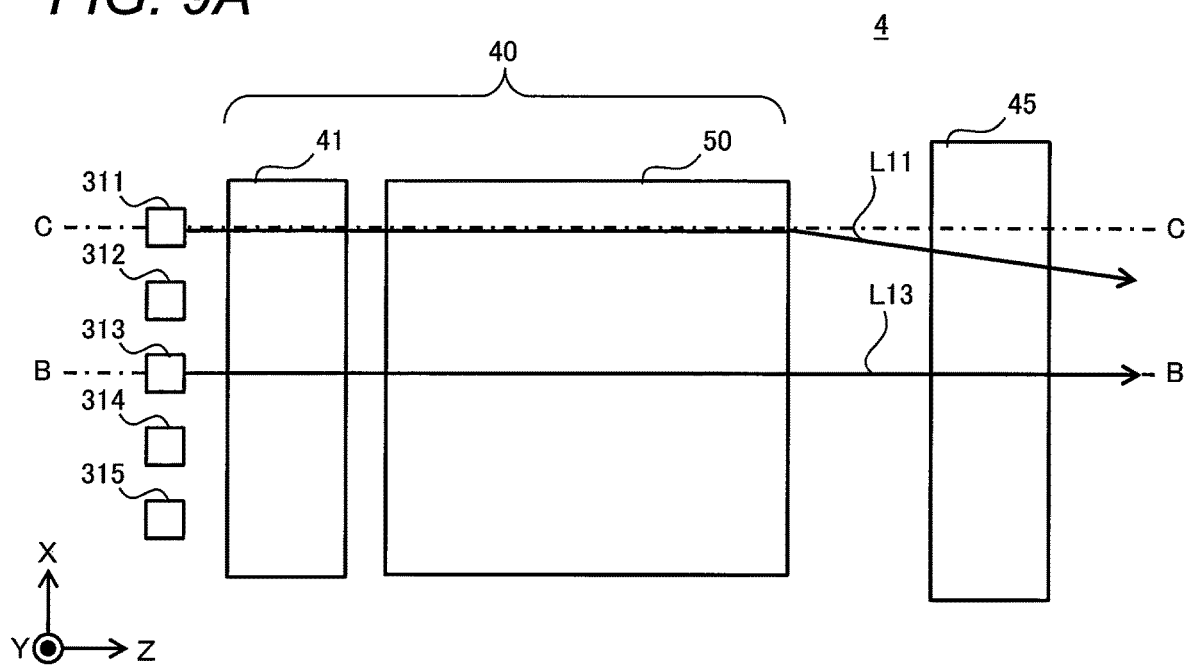
FIGS. 9A to 9C are optical path diagrams illustrating a chief ray in the optical unit of FIG. 7.
Figure 9B:
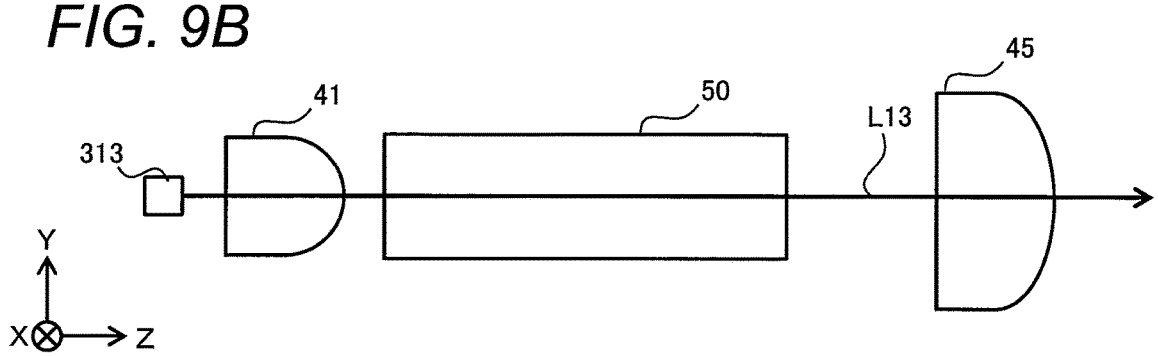
Figure 9C:
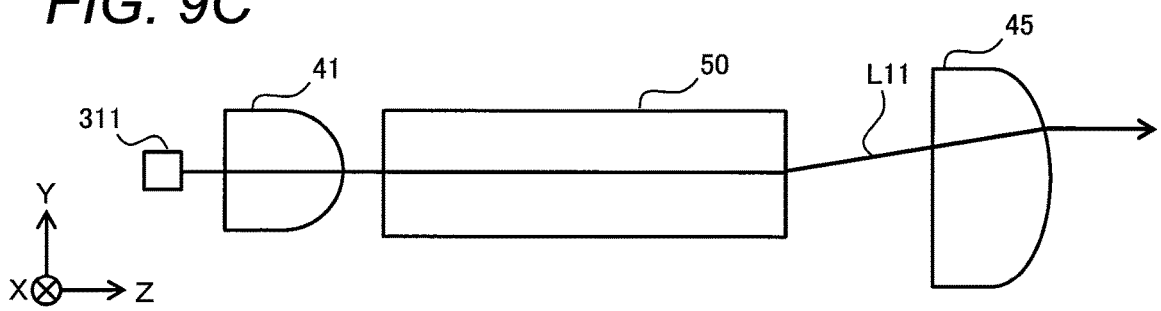

FIGS. 9A to 9C exemplify the optical path in the optical unit 4 of this configuration example. FIG. 9A corresponds to the A-A cross section in the optical unit 4 of FIG. 7. The A-A cross section is an XZ plane in which each LDs 311 to 315 of the LD bar 3 is located. FIGS. 9B and 9C correspond to the B-B cross-sectional view and the C-C cross-sectional view in FIG. 9A, respectively. The B-B cross section is the YZ plane where the central LD 313 is located. The C-C cross section is the YZ plane where the outer LD 315 is located.

According to the optical unit 4 of the present embodiment, as illustrated in FIGS. 9A to 9C, the chief ray of the light beam from each LD 31, entering the FAC 41, goes straight along the Z direction to reach the +Z side surface of the BT 50. On the +Z side surface of the BT 50A, the chief ray La can be directed more outward in the X direction and inclined in the Y direction as the LD 31*a* is located more outside in the X direction, according to the pitch Wo of the oblique lens portion 51 which is smaller than that of the −Z side surface.

Each of chief rays La and Lc exits from the BT 50 to reach the SAC 45. Here, as the SAC 45 collimates the light beam in the Y direction, the inclination of the chief ray Lc in the Y direction can be corrected in the SAC 45 as illustrated in FIG. 9C.

As described above, according to the optical unit 4 of the present embodiment, the chief ray Lc of the outer LD 31*c* in the X direction can be restricted to the X direction and directed inward.

2-3. Examples of First Embodiment

Examples relating to the configuration example of the beam coupling device 2 and the optical unit 4 of the present embodiment as described above will be described below.

As a numerical example of the beam coupling device 2 of the present embodiment, a numerical simulation using the optical unit 4 of the above configuration example were performed. In this simulation, the focal length of the SAC 45 was set to 50 mm, the focal length of the coupling lens 24 was set to 1130 mm, and the pitch between LDs 31 of LD bar 3 was set to 0.225000 mm. In such a simulation environment, as the present embodiment, the pitch Wo on the +Z side of the BT 50 was set to be 230 nm smaller than the pitch Wi on the −Z side. The pitch Wi on the −Z side of the BT 50 was set to be the same as the pitch between the LDs of the LD bar 3.

FIG. 10A illustrates the simulation results of the beam coupling device 2 of the present embodiment. In this simulation, numerical calculation of the chief ray on the +X side was performed in order to check the effect of shifting the pitch Wi and Wo of the BT 50 in the above settings. Each row in the drawing shows the numerical calculation result for each surface number from the object side (i.e., −Z side) to the image side (i.e., +Z side) with the chief ray passing through each portion of the beam coupling device 2. As a numerical calculation result, "X" represents an X coordinate, "Y" represents a Y coordinate, "TANX" represents an inclination in the XZ plane with a tangent function, and "TANY" represents an inclination in the YZ plane with the tangent function. The position of LD 31 corresponding to the numerically calculated chief ray was 4 mm in the X coordinate.

According to the simulation results in FIG. 10A, "TANX" was changed from a zero value at the emission by the LD 31 to a positive value "−0.00346" after the exit of the SAC 45, indicating that the chief ray on the +X side is directed inward. Furthermore, "TANY" was not changed at a zero value from the exit of the SAC 45 to the diffraction element 25. Therefore, it was checked that the outer chief ray in the X direction can be directed inward in the X direction with suppressing the influence in the Y direction according to the deviation of Wi and Wo of the BT 50.

FIG. 10B illustrates the simulation results of a comparative example with respect to FIG. 10A. In this comparative example, the same numerical calculation as in FIG. 10A was performed in a case where the BTU pitch is not shifted on both sides of the ±Z side but the BTU is rotated in the XY plane. A technique for making an outer chief ray by rotating an optical element such as an BTU has been known in the related art (e.g., Patent Document 1). The rotation angle of BTU was set to 0.008°.

According to the simulation result of FIG. 10B, the value "−0.00346" of "TANX" after the exit of the SAC is equivalent to the example of FIG. 10A. On the other hand, "TANY" had a value of "0.0007" after the exit of the SAC. This indicates that, in this comparative example, directing the outer chief ray inward in the X direction causes an influence of an inclination in the Y direction. From the above, it was checked that the optical unit 4 of the present embodiment can realize the inward direction of the outer chief ray in the X direction with suppressing the influence in the Y direction as compared with the technique in the related art.

3. Summary

As described above, the optical unit 4 in the present embodiment is provided for guide a plurality of light beams. The BT 50 of the optical unit 4 includes a plurality of oblique lens portions 51 as an example of a plurality of lens portions through which a plurality of light beams are transmitted. The plurality of oblique lens portions 51 are arranged in an arrangement direction (e.g., the X direction) that intersects the optical axis direction (e.g., the Z direction) along which the light beam is transmitted. Each oblique lens portion 51 is inclined with respect to a thickness direction (e.g., the Y direction) intersecting the optical axis direction and the arrangement direction. In the optical unit 4 of the present embodiment, the pitch Wo at which the oblique lens portions 51 are arranged in the end face on the +Z side as an example of one end face of both end faces of the BT 50 in the optical axis direction is smaller than the pitch Wi at which the oblique lens portion 51 is arranged in the end face on the −Z side as the other end face.

According to the above optical unit 4, in an example when a plurality of light beams are incident from the −Z side at the same pitch as the pitch Wi of the oblique lens portion 51 on the −Z side of the BT 50, as the pitch Wo of the oblique lens portion 51 is smaller on the +Z side, the outer chief ray L11 of the light beam in the X direction can be directed inward. Therefore, it is possible to control the light ray direction that guides the light beam so as to condense a plurality of light beams. In this way, the BT 50 of the optical unit 4 can improve the degree of freedom in design for guiding a plurality of light beams.

In the present embodiment, the BTU 40 of the optical unit 4 includes a FAC 41 as an example of the first collimator lens. The FAC 41 is arranged to face the end face on the −Z side, which is either end face of the both end faces on the ±Z side of the BT 50, with a light beam being incident on the oblique lens portion 51 from the end face. According to the BTU 40 of the present embodiment, it is possible to control the light ray direction of a plurality of light beams incident from the FAC 41.

In the present embodiment, the optical unit 4 further includes a SAC 45 as an example of the second collimator lens. The SAC 45 is arranged to face the end face on the +Z side, which is the opposite side of the end face facing the FAC 41, among both end faces of the BT 50, to collimate the light beam emitted from the end face. According to the SAC 45, it is possible to correct the light ray direction of a light beam whose the light ray direction is changed in BT 50 incident from the FAC 41, and it is possible to easily control the light ray direction of a plurality of the light beams.

The beam coupling device 2 in the present embodiment includes an LD bar 3 as an example of a light source, an optical unit 4, and a diffraction element 25. The LD bar 3 includes LDs 311 to 313 as a plurality of light emitters capable of resonating at different wavelengths from each other, to emit respectively a plurality of light beams from each of the LDs 311 to 313. The optical unit 4 is arranged to guide each light beam from the LD bar 3. The diffraction element 25 is arranged to diffract each light beam incident from the LD bar 3 via the optical unit 4, to couple a plurality of light beams that resonate at different wavelengths. The optical unit 4 is arranged so that among both end faces of the BT 50, the end face on the +Z side having a small pitch Wo of the oblique lens portion 51 faces the diffraction element 25.

According to the above beam coupling device 2, when a plurality of light beams resonating at different wavelengths are diffracted and coupled by the diffraction element 25, the plurality of light beams can be condensed on the diffraction element 25 by the optical unit 4. By improving the degree of freedom in design, the device configuration of the beam coupling device 2 can be downsized.

In the present embodiment, the wavelength of resonance via the diffraction element 25 for each LD 31 gradually changes according to the position of each LD 31 in the X direction, which is the arrangement direction. For example, the resonance wavelength λ becomes longer from LD 311 on the +X side to LD 315 on the −X side. As a result, the light beam from each LD 31 can be coupled via the diffraction element 25.

In the present embodiment, the pitch between the plurality of LDs 31 in the arrangement direction and the pitch Wi in which the oblique lens portions 51 are arranged on the end face on the −Z side closer to the light source among both end faces of the BTU 40 in the optical unit 2 are matched. This makes it possible to appropriately control the light beam from each LD 31.

In the present embodiment, the laser processing machine 1 includes the beam coupling device 2 and the processing head 11 arranged to irradiate a workpiece with a light beam coupled by the beam coupling device 2. The laser processing machine 1 of the present embodiment can be configured by using the beam coupling device 2 for wavelength beam combining, with reduced size from the improvement of the degree of freedom in design for guiding a plurality of light beams by the optical unit 4.

Second Embodiment

Hereinafter, the second embodiment will be described with reference to FIGS. 11 to 16. In the second embodiment, an example of applying an optical unit to a beam coupling device for spatial beam combining and a laser processing machine provided with the beam coupling device will be described.

Hereinafter, the laser processing machine, the beam coupling device, and the optical unit according to the present embodiment will be described by omitting the description of the same configuration and operation as the laser processing machine 1, the beam coupling device 2, and the optical unit 4 according to the first embodiment as appropriate.

1. Laser Processing Machine

Figure 11:
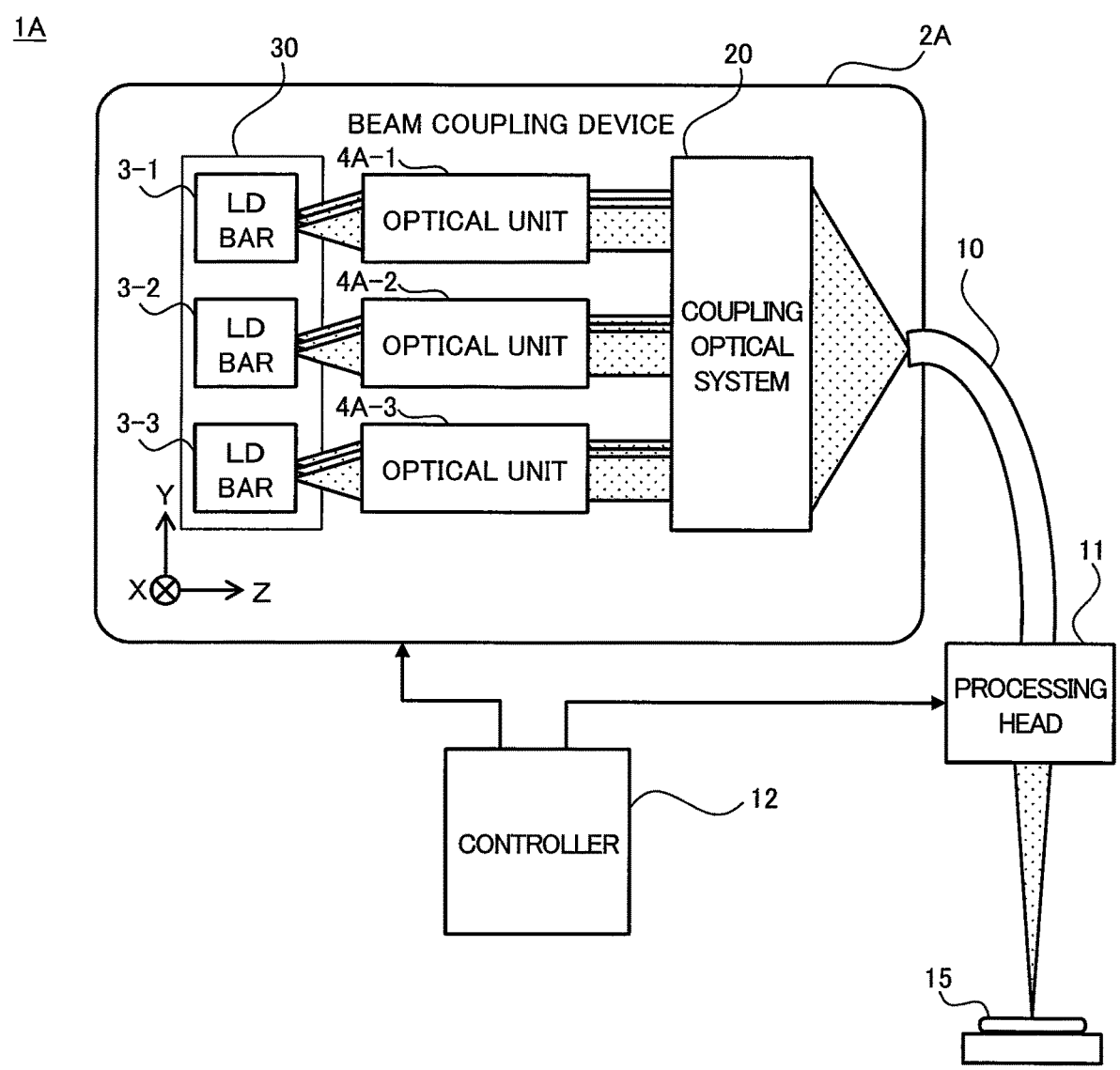
FIG. 11 is a diagram illustrating a configuration of a laser processing machine according to a second embodiment.

FIG. 11 is a diagram illustrating a configuration of a laser processing machine 1A according to the second embodiment. The laser processing machine 1 of the present embodiment has the configuration similar to the laser processing machine 1 of the first embodiment, but includes a beam coupling device 2A for spatial beam combining instead of the beam coupling device 2 for wavelength beam combining.

In the present embodiment, the beam coupling device 2A includes a laser light source 30, a plurality of optical units 4A-1 to 4A-3, and a coupling optical system 20. The laser light source 30 includes a plurality of LD bars 3-1 to 3-3 in the present embodiment. Each of the LD bars 3-1 to 3-3 is configured similarly to the LD bar 3 of the first embodiment, for example. Hereinafter, the generic term for LD bars 3-1 to 3-3 may be referred to as "LD bar 3", and the generic term for optical units 4A-1 to 4A-3 may be referred to as "optical unit 4A".

In the beam coupling device 2A, the plurality of LD bars 3 are juxtaposed in the Y direction orthogonal to the X direction, with the arrangement direction of each LD being set to be parallel to the X direction, for example. The number of LD bars 3 in the beam coupling device 2A is not particularly limited to three as the shown example, and may be two or four or more.

The beam coupling device 2A of the present embodiment is configured for spatial beam combining in which a large number of light beams emitted by each LD 31 of a plurality of LD bars 3 spatially arranged in the laser light source 30 are coupled. In the present embodiment, the beam coupling device 2A capable of performing beam coupling at a high density with a small beam diameter is provided.

In the beam coupling device 2A of the present embodiment, a plurality of optical units 4A are provided for the number of LD bars 3, for example. One optical unit 4A guides light beams from respective LDs in one LD bar 3 to the coupling optical system 20. The coupling optical system 20 is an optical system that couples the light beams from each optical unit 4A in the beam coupling device 2A.

1-1. Beam Coupling Device

FIGS. 12A and 12B are diagrams illustrating a configuration of a beam coupling device 2A according to the second embodiment. FIG. 12A illustrates a side view of the beam coupling device 2A as viewed from the X direction. FIG. 12B illustrates a plan view of the beam coupling device 2A as viewed from the Y direction.

In the beam coupling device 2A of the present embodiment, as illustrated in FIG. 12A, each LD bar 3 is arranged on the −Z side of a separate optical unit 4A, for example. In the optical unit 4A of the present embodiment, the configuration of the BTU 40A is different from the configuration of the optical unit 4 of the first embodiment. The coupling optical system 20 is arranged on the +Z side of the optical unit 4A and includes an axially symmetric condenser lens 21 and a cylindrical lens 22 arranged between the condenser lens 21 and the optical unit 4A.

FIG. 12B exemplifies the five LDs 31a, 31b, 31c, 31d, and 31e in the LD bar 3. In the present embodiment, the resonance wavelengths of the individual LDs 31a to 31e may be the same. The plurality of LDs 31a to 31e in the LD bar 3 are an example of a set of light emitters in the laser light source 30 of the present embodiment. Hereinafter, the generic term of LDs 31a to 31e may be referred to as "LD 31".

FIGS. 12A and 12B exemplify a beam coupling position P1 resulted from coupling the light beam by the beam coupling device 2A. The beam coupling position P1 is set to a position at which a beam diameter including the light beam emitted from each of the LDs 31a to 31e of all the LD bars 3-1 to 3-3 is minimized, for example. For example, an incident end of the optical fiber of the transmission optical system 10 described above is arranged at the beam coupling position P1.

FIG. 12A exemplifies a chief ray L1 of the light beam from the outer LD bar 3-1 in the Y direction, and a chief ray L2 of the light beam from the central LD bar 3-2. FIG. 12B exemplifies a chief ray La of the light beam from the outer LD 31a in the X direction, and a chief ray Lc of the light beam from the central LD 31c. In the beam coupling device 2A of the present embodiment, the LD 31c central in the X and Y directions has a chief ray Lc parallel to the Z direction similar to the first embodiment, for example.

In the present embodiment, as illustrated in FIG. 12A, the chief ray L1 of the light beam emitted by the outer LD bars 3-1 of the plurality of LD bars 3 arranged in the Y direction is directed inward, in view of increasing the output of the beam coupling device 2A for spatial beam combining, for example. Such light ray control can be performed by inclining the outer optical unit 4A-1 or shifting the arrangement of the SAC 45 inward. For example, the upper (+Y side) optical unit 4A in the drawing makes the chief ray L1 of the light beam inclined from the Z direction to the lower side (−Y side). In this case, the beam coupling position P1 in the Y direction where the chief rays L1 and L2 intersect between the LD bars 3 is located on the −Z side from a focal position P0 of the condenser lens 21.

On the other hand, as illustrated in FIG. 12B, in a plurality of LDs 31a to 31e arranged in the X direction for each LD bar 3, the optical unit 4A of the beam coupling device 2A of the present embodiment is configured to make the chief ray La of the light beam from the outer LD 31a directed outward. As a result, the position where the plurality of light beams intersect can be brought closer to the focal point of the condenser lens 21, the beam diameter itself at the coupling of each light beam can be reduced, and the density of the light beam incident on the coupling optical system 20 can be increased. Further, according to the cylindrical lens 22 of the coupling optical system 20, the beam coupling position P1 can match the beam coupling position P1 in the X direction and the Y direction.

2. Optical Unit

Hereinafter, the optical unit 4A of the beam coupling device 2A according to the second embodiment will be described.

Figure 13:
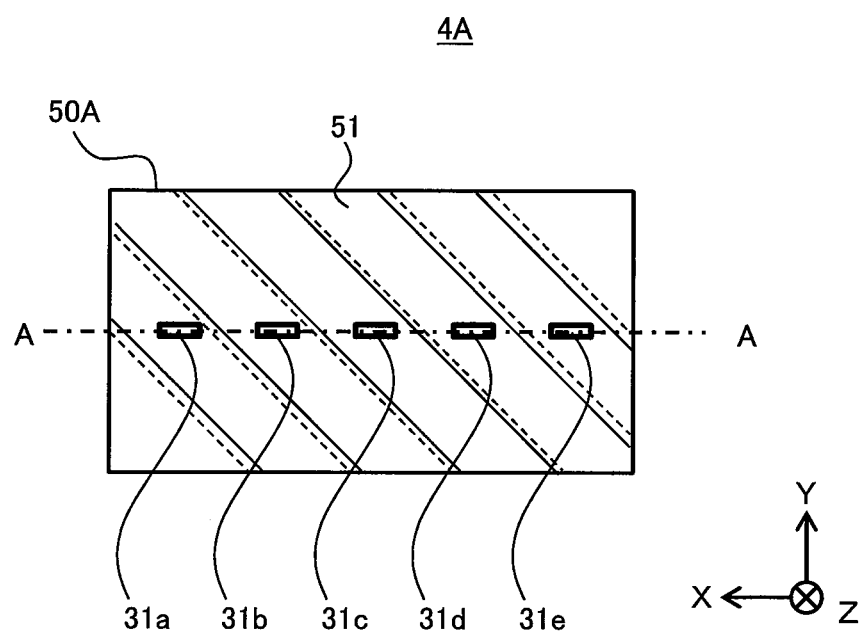
FIG. 13 illustrates a configuration example of the optical unit in the second embodiment.

FIG. 13 illustrates a configuration example of the BT 50A of the optical unit 4A in the second embodiment. For example, the optical unit 4A of the present embodiment includes a BT 50A of the configuration example of FIG. 13, in place of the BT 50 having the pitch Wo on the +Z side smaller than the pitch Wi on the −Z side in the optical unit 4 of the first embodiment.

Figure 14:
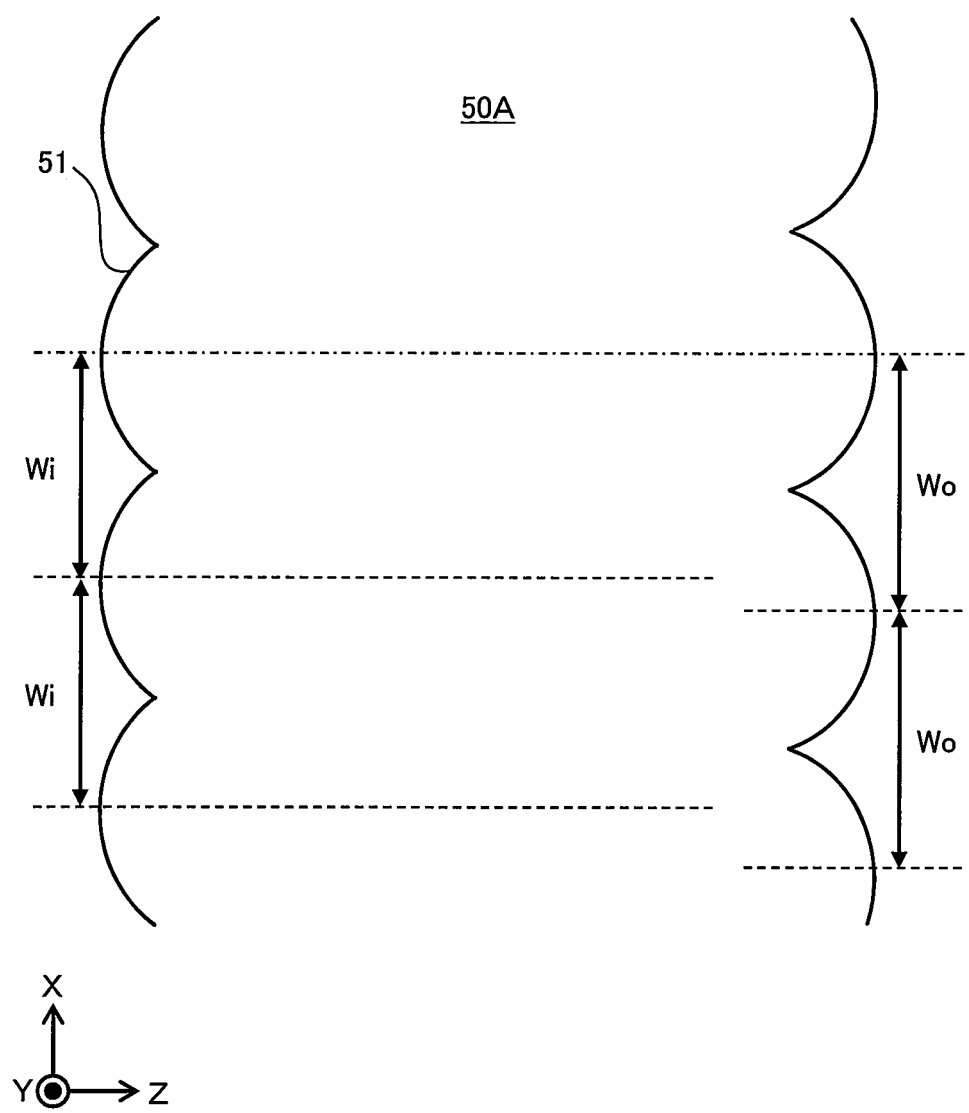
FIG. 14 is a cross-sectional view of the optical unit of FIG. 13.

FIG. 14 illustrates a cross-sectional view of the XZ plane in the BT 50A of FIG. 13. In the BT 50A of this configuration example, a pitch Wi on the −Z side is smaller than a pitch Wo on the +Z side. In other words, the BT 50A of this configuration example is configured so that the pitch Wo between the oblique lens portions 51 on the end face on the +Z side is larger than the pitch Wi on the end face on the −Z side. In the BT 50A of this configuration example, the curved surface shape of the oblique lens portion 51 on the end face on the +Z side can be set to extend the curved surface shape on the −Z side, for example.

Further, in this configuration example, the pitch Wi on the −Z side is set according to the pitch between the LDs 31 in the LD bar 3 as in the BT 50 of the first embodiment, for example. The magnitude of the difference between the pitches Wi and Wo may be within the same range as that of the first embodiment. The BT 50A and BTU 40A of the present embodiment are also examples of optical units as in the first embodiment.

Figure 15A:
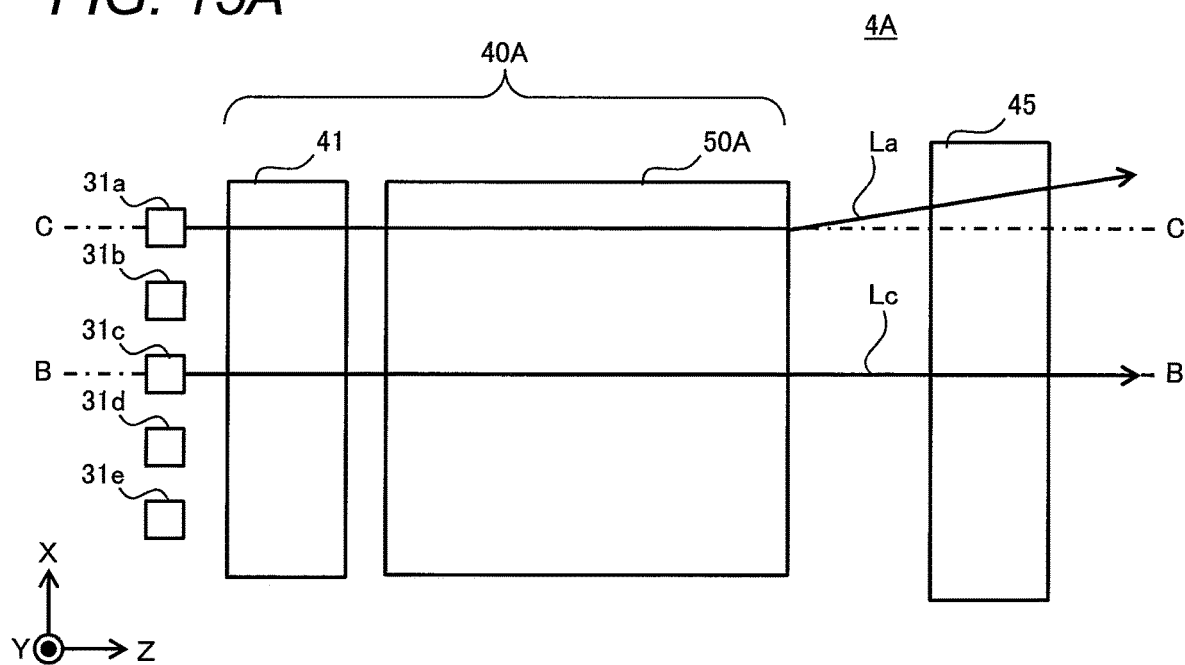
FIGS. 15A to 15C are optical path diagrams illustrating a chief ray in the optical unit of FIG. 13.
Figure 15B:
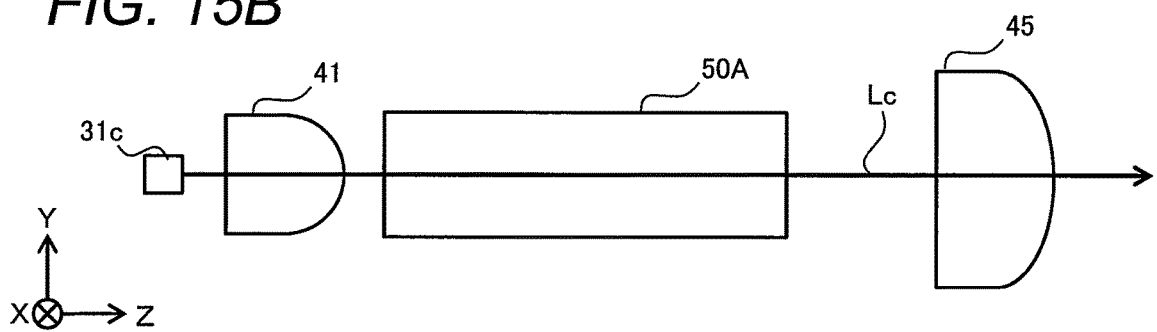
Figure 15C:
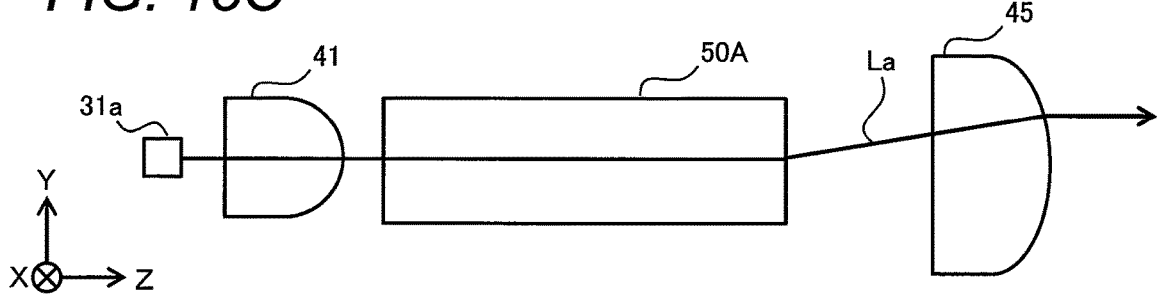

FIGS. 15A to 15C illustrate the optical path in the optical unit 4A of the present embodiment, in the same manner as in FIGS. 9A to 9C. FIG. 15A corresponds to the A-A cross section of FIG. 13. FIGS. 15B and 15C correspond to the B-B cross-sectional view and the C-C cross-sectional view in FIG. 15A, respectively. The BT 50A of the present embodiment faces the SAC 45 on the +Z side and faces the FAC 41 on the −Z side, as in the first embodiment.

According to the optical unit 4A of the present embodiment, as to the chief ray of the light beam from each LD 31 as illustrated in FIGS. 15A to 15C, the chief ray La is directed more outward in the X and Y directions as the LD 31a is located more outside in the X direction, according to the pitch Wo of the oblique lens portion 51 on the end face on the +Z side of the BT 50A wherein the pitch Wo is larger than the pitch between LDs 31. As illustrated in FIG. 15C, the inclination of the chief ray La in the Y direction is corrected in the SAC 45 in the same manner as in the first embodiment.

As described above, according to the optical unit 4A of the present embodiment, the chief ray Lc of the outer LD 31c in the X direction can be restricted to the X direction and directed outward.

2-1. Examples of Second Embodiment

FIG. 16 illustrates the simulation results of an example of the beam coupling device 2A of the second embodiment. In this simulation, the same numerical calculation as in the first embodiment was performed in the simulation environment of the beam coupling device 2A for spatial beam combining. In this simulation, the distance between the plurality of optical units 4A was set to 4.8 mm, the focal length of the SAC 45 was set to 15 mm, and the focal length of the condenser lens 21 was set to 50 mm.

In this simulation, the same numerical calculation as in the first embodiment was performed by setting that the pitch Wo on the +Z side of the BT 50A is made larger by 318 nm than the pitch Wi on the −Z side. The pitch between the pitch Wi on the −Z side of the BT 50A and the LD of the LD bar 3 was 0.225000 mm as in the first embodiment.

According to the simulation result of FIG. 16, "TANX" has a positive value of "0.00443" after the exit of the SAC 45, and the chief ray on the +X side is directed outward. Further, the value "0.00003" of "TANY" at this time is sufficiently smaller than the above-mentioned "TANX". Therefore, it was checked that the outer chief ray in the X direction can be directed outward in the X direction while keeping the inclination in the Y direction slightly.

3. Summary

As described above, in the optical unit 4A of the present embodiment, the pitch Wi in which the oblique lens portions 51 are arranged on the end face on the −Z side as an example of one end face of both end faces of the BT 50 in the optical axis direction is smaller than the pitch Wo at which the oblique lens portion 51 is arranged on the end face on the +Z side as an example of the other end face.

According to the above optical unit 4A, in an example when a plurality of light beams are incident from the −Z side at the same pitch as the pitch Wi of the oblique lens portion 51 on the −Z side of the BT 50A, as the pitch Wo of the oblique lens portion 51 is larger on the +Z side, the outer chief ray La of the light beam in the X direction can be directed outward. In this way, the BT 50A of the optical unit 4A can improve the degree of freedom in design for guiding a plurality of light beams.

In the present embodiment, the beam coupling device 2A includes a laser light source 30 as an example of the light source, a plurality of optical units 4A, and a coupling optical system 20. The laser light source 30 includes LDs 31 which is an example of a plurality of light emitters arranged in the X direction and the Y direction, for example. The plurality of optical units 4A are arranged to guide each light beam for each LD bar 3 as a set of LD 31$a$ to LD 31$e$ arranged in the X direction in the laser light source 30. The coupling optical system 20 is arranged to couple a plurality of light beams guided to each optical unit 4A. The optical unit 4A is arranged so that among both end faces of the BT 50, the end face on the +Z side having a large pitch Wo of the oblique lens portion 51 faces the coupling optical system 20.

According to the above beam coupling device 2A, when a plurality of light beams are coupled, the beam diameter itself at the beam coupling position 21 can be reduced by making the outer chief ray L11 in the X direction directed outward by the optical unit 4A. In this way, by improving the degree of freedom in design by the optical unit 4A, it is possible to improve the beam quality in the coupling device 2A for spatial beam combining.

Other Embodiments

As described above, the first and second embodiments are described as an example of the technique disclosed in the present application. However, the technique in the present disclosure is not limited thereto, and can also be applied to embodiments in which changes, substitutions, additions, omissions, and the like are made as appropriate. In addition, it is also possible to combine each component described in each embodiment to form a new embodiment. Thus, in the following, other embodiments will be exemplified.

In the first embodiment described above, an example of the beam coupling device 2 for wavelength beam combining has been described, but the configuration of the beam coupling device 2 is not particularly limited to this example. For example, an example in which the transmission type diffraction element 25 is used for the beam coupling device 2 has been described, but the diffraction element 25 is not limited to the transmission side and may be a reflection type. Further, in FIG. 3, the 900 nm band is illustrated as the wavelength band in which the LD 31 emits light; however, the wavelength band of the LD 31 is not particularly limited and may be the 400 nm band, for example. According to the optical unit 4 of the present embodiment, even in the optical design of such various beam coupling devices 2 for wavelength beam combining, the light ray direction of the light beam can be controlled such that the BT 50 has the light-condensing function, and the degree of freedom in design can be improved.

In the second embodiment described above, an example of the beam coupling device 2A for spatial beam combining has been described, but the configuration of the beam coupling device 2A is not particularly limited to this example. For example, the beam coupling device 2A for inwardly directing the outer chief ray L1 in the Y direction has been described; however, the chief ray L1 may not be inwardly directed, and may be outwardly directed, for example. Further, an example in which the cylindrical lens 22 is used for the coupling optical system 20 has been described, but the cylindrical lens 22 may be omitted. According to the optical unit 4A of the present embodiment, even in the optical design of such various coupling devices 2A for spatial beam combining, the degree of freedom in design can be improved.

In the above embodiments, an example of applying the optical units 4 and 4A to beam coupling devices 2 and 2A for wavelength beam combining and spatial beam combining has been described. The optical unit of the present embodiment is not limited to the e coupling device for wavelength beam combining or spatial beam combining, and may be applied to various beam coupling devices. The optical unit of the present embodiment can also be applied to a beam coupling device in which wavelength beam combining and spatial beam combining are appropriately used.

As described above, the embodiments are described as the exemplification of the technique in the present disclosure. To that end, the accompanying drawings and the detailed description are provided.

Therefore, among the components described in the accompanying drawings and the detailed description, not only the component essential for solving the problem, but also the component not essential for solving the problem may be included in order to exemplify the above technique. Therefore, it should not be certified that these non-essential components are essential immediately because these non-essential components are described in the accompanying drawings and the detailed description.

In addition, since the above embodiment is for illustrating the technique in the present disclosure, various changes, substitutions, additions, omissions, and the like can be made within the scope of the claims or the equivalent thereof.

INDUSTRIAL APPLICABILITY

The present disclosure is applicable to various applications in which a plurality of light beams are coupled and used, and is applicable to various laser processing techniques, for example.

The invention claimed is:

1. An optical unit for guiding a plurality of light beams, comprising:
   a first end face and a second end face; and
   a plurality of lens portions through which the plurality of light beams are transmitted via the first end face and the second end face, wherein
   the plurality of lens portions are arranged in an arrangement direction that intersects an optical axis direction along which the light beams are transmitted,
   each of the lens portions is inclined with respect to a thickness direction intersecting the optical axis direction and the arrangement direction, and
   a pitch between the lens portions on the first end face of the optical unit is smaller than a pitch between the lens portions on the second end face of the optical unit.

2. The optical unit according to claim 1, further comprising a first collimator lens arranged to face either end face of the both end faces with a light beam being incident on each of the lens portions from the end face.

3. The optical unit according to claim 2, further comprising a second collimator lens arranged to face another end face of the both end faces opposite to the one end face on which the first collimator lens faces, to collimate a light beam emitted from the other end face.

4. A beam coupling device comprising:
a light source that includes a plurality of light emitters capable of resonating at different wavelengths from each other, to emit a plurality of light beams from the light emitters respectively;
the optical unit according to claim 1, to guide each of the light beams from the light source; and
a diffraction element arranged to diffract each of the light beams incident from the light source via the optical unit for coupling the plurality of light beams that resonate at different wavelengths, wherein
the optical unit is arranged with the diffraction element facing the end face in which the pitch of the lens portion is smaller among pitches in the both end faces.

5. The beam coupling device according to claim 4, wherein a wavelength of resonance via the diffraction element for each of the light emitters changes according to a position of each of the light emitters in the arrangement direction.

6. A beam coupling device comprising:
a light source that includes a plurality of light emitters arranged in the arrangement direction and the thickness direction, to emit a plurality of light beams from each of the light emitters;
a plurality of the optical units according to claim 1, to guide each of the light beams for each set of the light emitters arranged in the arrangement direction in the light source; and
a coupling optical system arranged to couple the plurality of light beams guided by each of the optical units, wherein
the optical unit is arranged with the coupling optical system facing the end face in which the pitch of the lens portion is larger among pitches in the both end faces.

7. The beam coupling device according to claim 4, wherein a pitch between the plurality of light emitters in the arrangement direction are matched with the pitch at which the lens portions are arranged in the end face closer to the light source among the both end faces of the optical unit.

8. A laser processing machine comprising:
the beam coupling device according to claim 4; and
a processing head arranged to irradiate a workpiece with a light beam coupled by the beam coupling device.

9. The beam coupling device according to claim 6, wherein a pitch between the plurality of light emitters in the arrangement direction are matched with the pitch at which the lens portions are arranged in the end face closer to the light source among the both end faces of the optical unit.

10. A laser processing machine comprising:
the beam coupling device according to claim 6; and
a processing head arranged to irradiate a workpiece with a light beam coupled by the beam coupling device.

* * * * *